(12) United States Patent
Vagher et al.

(10) Patent No.: US 8,310,304 B1
(45) Date of Patent: Nov. 13, 2012

(54) POWER AMPLIFIER CONTROL SYSTEM WITH GAIN CALIBRATION

(75) Inventors: Michael R. Vagher, Cedar Rapids, IA (US); Clayton Harmon, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 9 days.

(21) Appl. No.: 12/974,465

(22) Filed: Dec. 21, 2010

(51) Int. Cl.
*H03G 3/20* (2006.01)

(52) U.S. Cl. ........................................ 330/129; 330/136

(58) Field of Classification Search .................. 330/129, 330/136, 140, 284, 293
See application file for complete search history.

(56) References Cited

U.S. PATENT DOCUMENTS

| | | | |
|---|---|---|---|
| 6,252,455 B1 * | 6/2001 | Kurby et al. | 330/136 |
| 6,337,599 B2 * | 1/2002 | Lee | 330/149 |
| 7,023,278 B1 | 4/2006 | Vagher et al. | |

* cited by examiner

*Primary Examiner* — Hieu Nguyen
(74) *Attorney, Agent, or Firm* — Donna P. Suchy; Daniel M. Barbieri

(57) ABSTRACT

A digital power amplifier is disclosed. The digital power amplifier may comprise an amplifying stage configured for applying a first level of attenuation to an RF input signal in response to a desired output power level of the digital power amplifier; a reference loop configured for determining an average power of a sample of the RF input signal and providing a reference value at least partially based upon the average power of the sample of the RF input signal; a feedback loop configured for applying a second level of attenuation to a sample of an output of the amplifying stage and providing a feedback value indicating an average power of the attenuated sample of the output; and an error amplifier configured for providing a gain control adjustment signal to the amplifying stage, the gain control adjustment signal being determined based upon the reference value and the feedback value.

17 Claims, 4 Drawing Sheets

POWER AMPLIFIER CONTROL SYSTEM WITH GAIN CALIBRATION

GOVERNMENT LICENSE RIGHTS

The U.S. Government has a paid-up license in this invention and the right in limited circumstances to require the patent owner to license others on reasonable terms as provided for by the terms of Government Contract No. N0019-08-G-0016 awarded by the Naval Air Systems Command.

TECHNICAL FIELD

The present disclosure relates generally to communications technology, and more particularly to power amplifiers utilized in communications receivers and/or transmitters.

BACKGROUND

An amplifier or amp is a device that changes (e.g., increases or decreases) the amplitude of a signal. The gain of an amplifier is the ratio of output to input power or amplitude, and may be measured in decibels (dB). A digital amplifier is an amplifier where the power devices are operated as binary switches.

SUMMARY

The present disclosure is directed to a digital power amplifier. The digital power amplifier may comprise an amplifying stage, the amplifying stage configured for applying a first level of attenuation to an RF input signal in response to a desired output power level of the digital power amplifier; a reference loop, the reference loop configured for determining an average power of a sample of the RF input signal, the reference loop further configured for providing a reference value at least partially based upon the average power of the sample of the RF input signal; a feedback loop, the feedback bop configured for applying a second level of attenuation to a sample of an output of the amplifying stage, the second level of attenuation being inversely proportional to the first level of attenuation, the feedback bop further configured for providing a feedback value indicating an average power of the attenuated sample of the output; and an error amplifier, the error amplifier configured for providing a gain control adjustment signal to the amplifying stage, the gain control adjustment signal being determined based upon the reference value and the feedback value.

A further embodiment of the present disclosure is directed to a digital power amplifier. The digital power amplifier may comprise an amplifying stage, the amplifying stage configured for applying a first level of attenuation to an RF input signal in response to a desired output power level of the digital power amplifier; a feedback loop, the feedback loop configured for applying a second level of attenuation to a sample of an output of the amplifying stage, the second level of attenuation being inversely proportional to the first level of attenuation, the feedback loop further configured for providing a feedback value indicating an average power of the attenuated sample of the output; a power measurement unit, the power measurement unit configured for measuring the average power of the attenuated sample of the output and converting the measurement to a digitized power level; an automatic level control, the automatic level control configured for providing a gain control signal based upon the digitized power level and the desired output power level of the digital power amplifier; a reference loop, the reference loop configured for determining an average power of a sample of the RF input signal, the reference loop further configured for providing a reference value based upon the average power of the sample of the RF input signal and the gain control signal provided by the automatic level control; and an error amplifier, the error amplifier configured for providing a control adjustment signal to the amplifying stage, the control adjustment signal being determined based upon the reference value and the feedback value.

An additional embodiment of the present disclosure is directed to a method for providing gain control in a digital power amplifier. The method may comprise receiving an RF input signal; sampling the RF input signal; generating a reference value based upon the sampled RF input signal; amplifying the RF input signal and producing an RF output signal in response to a desired output power level; sampling the RF output signal; generating a feedback value based upon the sampled RF output signal; determining a gain control signal based upon the reference value and the feedback value; and providing the gain control signal to the digital power amplifier.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DETAILED DESCRIPTION

Reference will now be made in detail to exemplary embodiments of the disclosure, examples of which are illustrated in the accompanying drawings.

Digital amplifiers used in communications networks may be required to provide several peak power levels and low power modes. The range of power levels required to be provided by a power amplifier may extend down 30 dB or more from the maximum power level. An exemplary digital power amplifier is disclosed in: Digital Power Amplifier Level Control, U.S. Pat. No. 7,023,278, which is herein incorporated by reference in its entirety. The disclosed digital power amplifier utilizes two digital control attenuators to supply inversely proportional attenuation control levels in a gain control loop. A schematic representation of this digital power amplifier 100 is depicted in FIG. 1.

Figure 1:
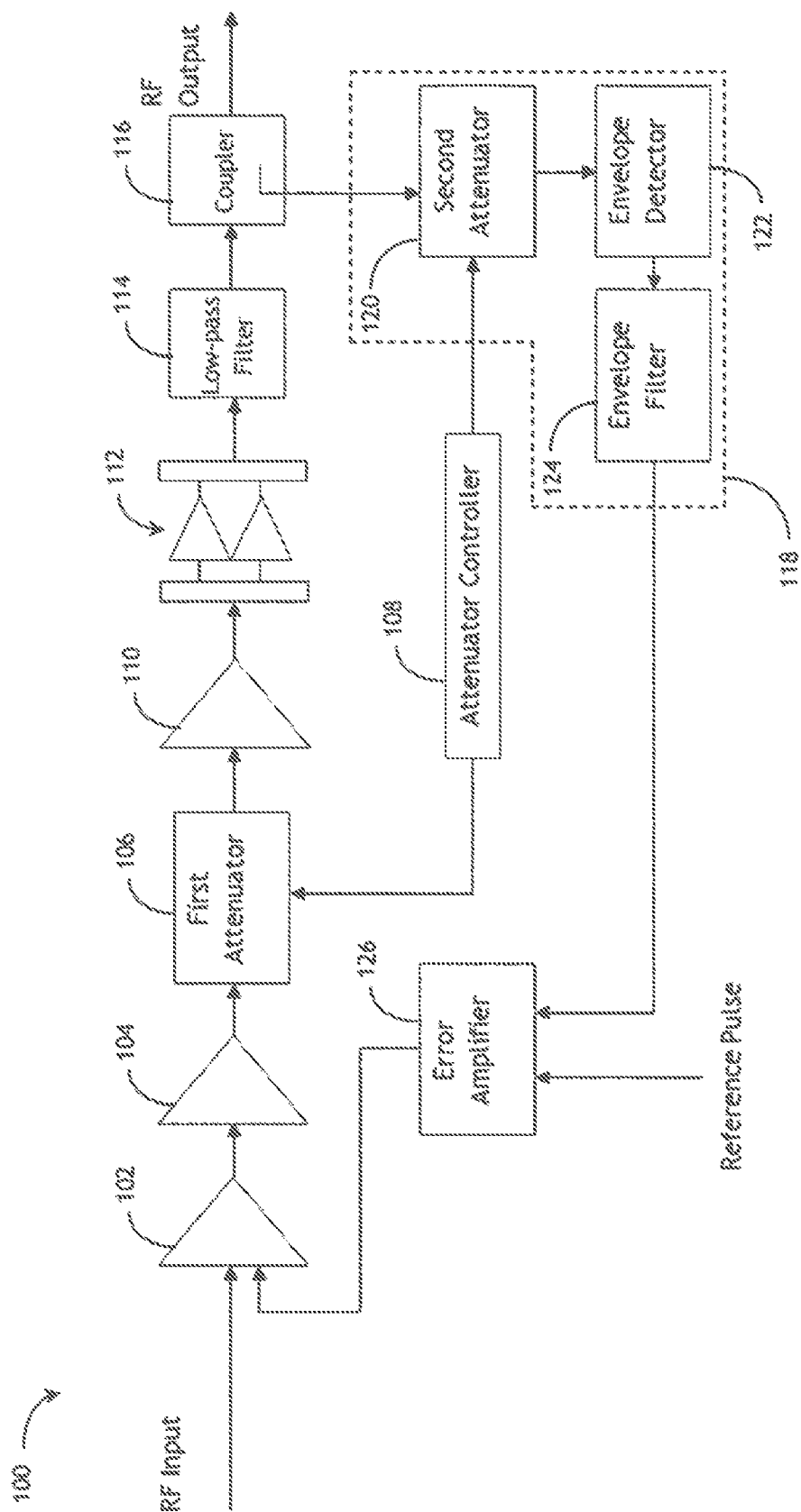
FIG. 1 is a schematic diagram illustrating a digital power amplifier having a feedback loop.

The digital power amplifier 100 includes an amplifying stage as illustrated in FIG. 1. An RF input is provided to a gain control element 102. The output of the gain control element 102 may be sent through a pre-driver amplifier 104 to a first digitally controlled attenuator 106. The first digitally controlled attenuator 106 may be controlled by an attenuator controller 108 and may apply a first level of attenuation to the RF signal. The attenuated RF signal may be sent through a driver 110 to the finals amplifier section 112.

The finals amplifier section 112 may include a pair of linearly-biased Laterally Diffused MOS (LDMOS) devices with gate voltage controlled bias. The LDMOS devices may provide a level of gain to the RF signal. The output from the finals amplifier section 112 may then go through a low-pass filter 114, which allows low-frequency signals to pass but attenuates signals with frequencies higher than a cutoff frequency. The output of the low-pass filter 114 may represent the RF output of the digital power amplifier 100.

The digital power amplifier 100 further includes a feedback loop 118 configured for providing output power control as well as pulse waveform control. The feedback loop 118 may receive RF output samples via a coupler 116. For example, the output signal from the low-pass filter 114 may be routed through the coupler 116, which takes a sample of the RF output signal at a predetermined rate (e.g., 1% of the actual signal level). The sampled signal may then be provided as input to the feedback loop 118.

The feedback loop 118 may include a second digitally controlled attenuator 120. The second digitally controlled attenuator 120 may also be controlled by the attenuator controller 108. The second digitally controlled attenuator 120 is configured for providing a second level of attenuation to the sampled RF output signal, where the second level of attenuation is inversely proportional with respect to the first level of attenuation provided by the first digitally controlled attenuator 106. For example, if the first digitally controlled attenuator 106 is increased by 1 dB (to apply 1 dB power reduction for the digital power amplifier), then the second digitally controlled attenuator 120 should be reduced by 1 dB. In another example, if the first digitally controlled attenuator 106 is minimized (to apply maximum power amplification for the digital power amplifier), then the second digitally controlled attenuator 120 should be maximized. In other words, assuming there are n discrete attenuation levels that either attenuator can assign, and that k is an integer between and including 1 and n. When the first attenuator 106 applies the $k_{th}$ lowest of the n attenuation levels, the second attenuator 120 applies the $k_{th}$ highest of the n attenuation levels.

The feedback loop 118 may further include an RF envelope detector 122 and an envelope filter 124. The RF envelope detector 122 is configured to detect the signal characteristics of the attenuated RF signal from the second digitally controlled attenuator 120. For example, the RF envelope detector 122 may detect the shape or peak of a signal envelope pulse. The output of the RF envelope detector 122 may be filtered and provided as input to an error amplifier 126. The error amplifier 126 may also take as its input a reference pulse. The reference pulse may be a predetermined/stored value configured for providing a reference to the feedback loop 118 to control the output power of the digital power amplifier 100.

In this manner, the feedback loop 118 may provide the necessary error gain and compensation functions to enable error amplifier 126 to drive the detected RF signal to match a reference pulse according to known principles. The output of the error amplifier 126 is the gain control input, which may be supplied as a control signal to the gain control element 102. The digital power amplifier 100 is therefore capable of providing multiple power levels while using a minimum number of control components.

The Mobile User Objective System (MUOS) is an array of geosynchronous satellites for providing global satellite communications for various entities. The MUOS waveform may adjust the output power of the amplifier over a 20 dB range with a combination of drive level changes and discrete changes in gain. While the digital power amplifier 100 as illustrated in FIG. 1 may be capable of providing multiple power levels, a further requirement for handling the MUOS waveform is the ability to provide precise gain control (as opposed to a traditional power level control). Therefore, the present disclosure is directed to a power amplifier capable of providing precise gain control utilizing a gain calibration loop.

Figure 2:
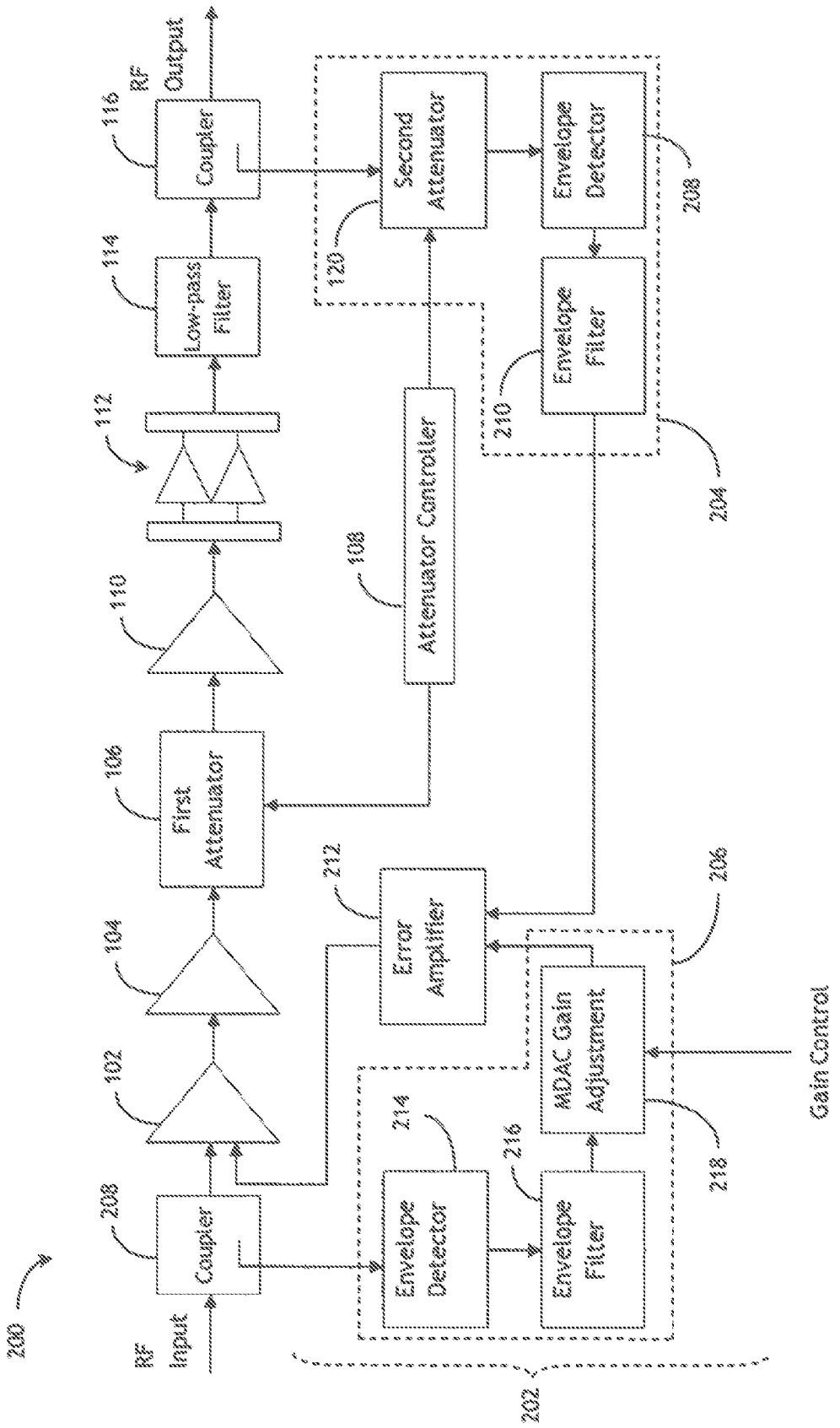
FIG. 2 is a schematic diagram illustrating a digital power amplifier having a pre-amplifying reference loop and a feedback loop.

Referring to FIG. 2, a block diagram illustrating a digital power amplifier 200 capable of providing precise gain control utilizing a gain calibration loop 202 is shown. In one embodiment, the gain calibration loop 202 includes a feedback loop 204 and a pre-amplifying reference loop 206. Both RF input and RF output signals are sampled and are sent to an envelope detector to detect the corresponding power levels. Differences between the RF input and RF output signals are determined and applied to the gain control element 102, which adjusts the output power to minimize such differences (e.g., reducing the difference to zero).

The feedback loop 204 may be similar to the feedback loop 118 described above. The feedback loop 204 may include a second attenuator 120 (as previously described), an RF envelope detector 208 and an envelope filter 210. The RF envelope detector 208 is configured to detect the signal characteristics (e.g., shape or peak characteristics) of the attenuated RF output signal. The envelope filter 210 may reduce the envelope variations (e.g., envelope variations such as those in a WCDMA waveform) and provide a feedback value indicating the average power of the output RF waveform. The average power of the output RF waveform may then be provided to the error amplifier 212. The error amplifier 212 may also take as its input a reference value, which is provided by the pre-amplifying reference loop 206.

The pre-amplifying reference loop 206 may receive RF input samples via a coupler 208. For example, the input signal may be routed through the coupler 208 before input into the gain control element 102. The coupler may take a sample of the input signal at a predetermined rate (e.g., 1% of the actual signal level) and provide the sample as input to the reference loop 206. The reference loop 206 may include an RF envelope detector 214, an envelope filter 216 and a multiplying digital to analogue converter (MDAC) gain adjustment unit 218. The RF envelope detector 214 is configured to detect the signal characteristics (e.g., shape or peak characteristics) of the RF input signal. The envelope filter 216 may reduce the envelope variations and provide a value indicating the average power of the input RF waveform. The average power of the input RF waveform may then be provided to the MDAC gain adjustment unit 218.

The MDAC gain adjustment unit 218 is configured for receiving the average power of the input RF waveform from the envelope filter 216, and providing a gain adjusted reference value to the error amplifier 212. In one implementation, the reference value is the product of the average power of the input RF waveform (from the envelope filter 216) and a gain control signal. The gain control signal may be provided by the communication system (e.g., MUOS) that is utilizing the digital power amplifier 200 for power amplification. For example, if the communication system is currently utilizing the digital power amplifier 200 to provide a specific level of power amplification, then a corresponding gain control signal may be provided by the communication system to represent the specific level, allowing the MDAC gain adjustment unit 218 to adjust the average power of the input RF waveform accordingly. It is understood that the gain control signals may be provided to the MDAC gain adjustment unit 218 as digital words.

For example, the MDAC gain adjustment unit 218 may include an operational amplifier and a current output digital to analogue converter (DAC). The MDAC gain adjustment unit 218 may then provide a voltage multiplier with a gain controlled by the value of a digital word loaded into the DAC. The transfer function of the MDAC gain adjustment unit 218 may be based on equation:

$$V_{out} = V_{in} \times \left(\frac{D}{2^N}\right)$$

Where N is the number of bits of the digital word (e.g., a 12-bit word would have N=12); and D is the fractional representation of the digital work loaded to the DAC (e.g., a 12-bit word would have D range from 0 to 4095).

For instance, if the 12-bit digital word input is 100000000000, the gain value ($V_{out}/V_{in}$) may be calculated as 2048/4096=0.5. Similarly, if the 12-bit digital word input is 100000000001, the gain value ($V_{out}/V_{in}$) may be calculated as 2049/4096=0.500244140625. This example illustrates the smallest resolution in gain steps possible with a 12-bit MDAC by changing the LSB (Least Significant Bit) of the digital word. In this manner, the MDAC gain adjustment unit 218 may be utilized to increment or decrement the gain in fractional dB values to provide finer resolution than the 1 dB steps provided by the first and second attenuators 106 and 120. It is understood, however, the 12-bit digital word described above is merely exemplary. The MDAC gain adjustment unit 218 may be configured for processing digital word of any given number of bits without departing from the spirit and scope of the present disclosure.

Once the gain adjusted reference value is calculated by the MDAC gain adjustment unit 218 and provided to the error amplifier 212, the error amplifier 212 may compare the feedback value (from the feedback loop 204) against the reference value (from the pre-amplifying reference loop 206) and provide control adjustments to the gain control element 102 accordingly. In one embodiment, the error amplifier 212 may be implemented as a difference amplifier configured for providing control adjustments to the gain control element 102 in order to minimize the differences between the feedback value and the reference value. The gain control element 102 may then provide a variable gain to the RF input signal based on the control adjustments. The variable gain to the RF input signal may be provided prior to the RF input signal being attenuated by the first digitally controlled attenuator 106.

It is contemplated that utilizing the reference value determined based on the RF input sample (instead of a predetermined/stored reference value) may provide a more precise gain control for the digital power amplifier 200. The detected envelope of the input RF signal, through the MDAC gain adjustment, provides a reference for the feedback loop to assure that the gain value is precisely calibrated. The calibration process may force the output RF to follow the input RF and therefore create a constant gain response. Furthermore, the power amplifier gain may be changed in discrete amounts (e.g., 1 dB) by digital control with a total gain control range of greater than 30 dB. In any of the selectable gain settings, the RF output drive may still follow the input RF drive since the gain control feedback loop is active in all gain settings.

It is also contemplated that the power amplifier with precise gain control in accordance with the present disclosure may be expanded to provide modulation for various other waveforms (e.g., AM waveforms, FM waveforms or the like) in addition to the MUOS waveform. For instance, the power amplifier may amplify an incoming amplitude modulated AM waveform and serve as a booster power amplifier. One of the requirements is that the amplitude modulation or envelope of the waveform should be reproduced with minimal added distortion and amplified to the desired level by the power amplifier. In addition, another requirement is the ability to produce the desired nominal average RF output power independent of the RF input drive level variations, which may require automatic level control of the RF output average power level.

Figure 3:
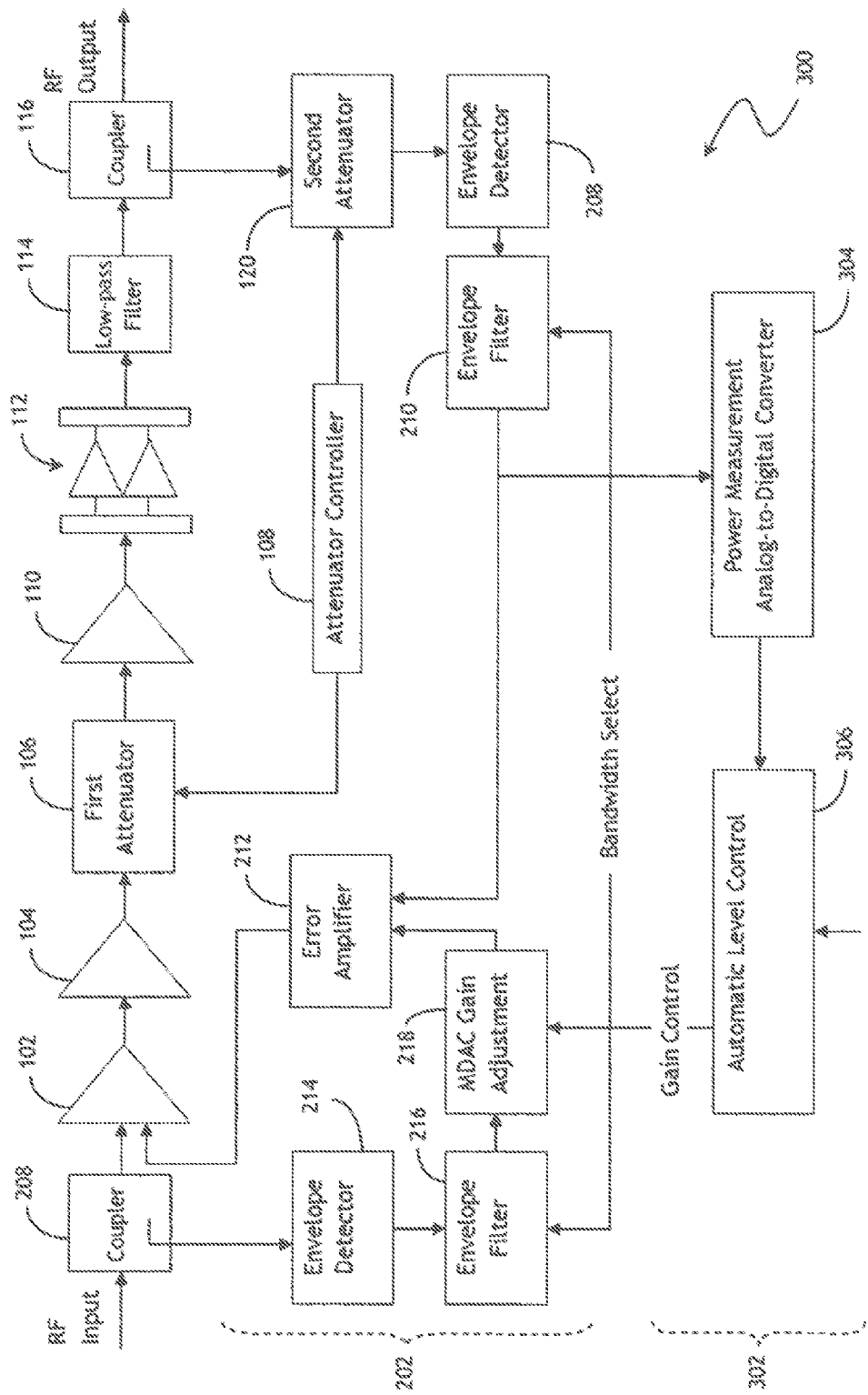
FIG. 3 is a schematic diagram illustrating a digital power amplifier having a pre-amplifying reference loop, a feedback loop and a power leveling loop.

Referring to FIG. 3, a block diagram illustrating a power amplifier 300 capable of providing precise gain control and power level control is shown. The power amplifier 300 may include a gain calibration loop 202 as described above to provide precise gain control. The power amplifier 300 may further include a power leveling loop 302 to provide power leveling control independent of the RF input drive level variations. In this manner, power amplifier 300 is capable of providing both low distortion amplification of the AM signal and automatic level control of the output power.

The power leveling loop 302 and the gain calibration loop 202 may operate based on different time constants. For example, the power leveling loop 302 may operate with a much longer time constant than the gain calibration loop 202, allowing the power leveling loop 302 and the gain calibration loop 202 to act independently. For example, the gain calibration loop 202 may operate with a typical time constant of 3 KHz for AM voice waveforms to create a constant gain to the input signals. However, the power leveling loop 302 may operate at a typical time constant of 1 second to in order to provide constant output power despite slow drifts in input power.

In one embodiment, the power leveling loop 302 may include a power measurement unit 304 communicatively connected with the envelope filter 210 of the feedback loop. The power measurement unit 304 may measure the average power level of the feedback signal provided by the feedback loop and convert the power level to a digitized power level representation. The digitized power level may be provided to an automatic level control 306.

The communication system that utilizes the power amplifier 300 for waveform modulation may specify a power level control signal. The power level control signal from the communication system may represent the power level desired by the communication system. The automatic level control 306 may compare the desired power level against the measured power level received from the power measurement unit 304 and compute the difference. The automatic level control 306 may therefore generate a gain control signal based on the computed difference. The gain control signal may then be provided to the MDAC gain adjustment unit 218, which may adjust the average power of the input RF waveform from the envelope filter 216 as previously described.

For example, the gain control signal provided by the automatic level control 306 may be a 12-bit digital word that is loaded into the MDAC gain adjustment unit 218 to increase or decrease the MDAC output. The adjustment in the MDAC output may subsequently adjust the RF output power of the power amplifier to the desired output power level. In this manner, the MDAC gain control digital word may have a direct ratio between digital values and amplifier output power. For example, an increase in the digital gain control from (100000000000) binary to (100000001111) binary may increase the output power by 0.25 dB.

While the gain calibration loop 202 of the power amplifier 300 may be implemented substantially the same as described above, the envelope filters 210 and 216 may be configured to receive a bandwidth selection signal. The bandwidth selection signal may be specified by the communication system that utilizes the power amplifier 300. The bandwidth selection signal may indicate a specific bandwidth of which the filters 210 and 216 should allow to go through. For example, if the communication system that utilizes the power amplifier 300 is an AM communication system, then the bandwidth selection signal provided to the filters 210 and 216 may allow the AM envelope of the RF input and RF output to go through. Communication systems that operate under different bandwidths may configure the bandwidth selection signal accordingly.

It is understood that utilizing the power amplifier 300 for AM waveform modulation as illustrate above is merely exemplary. Various other waveform modulations may utilize the power amplifier 300 without departing from the spirit and scope of the present disclosure.

Figure 4:
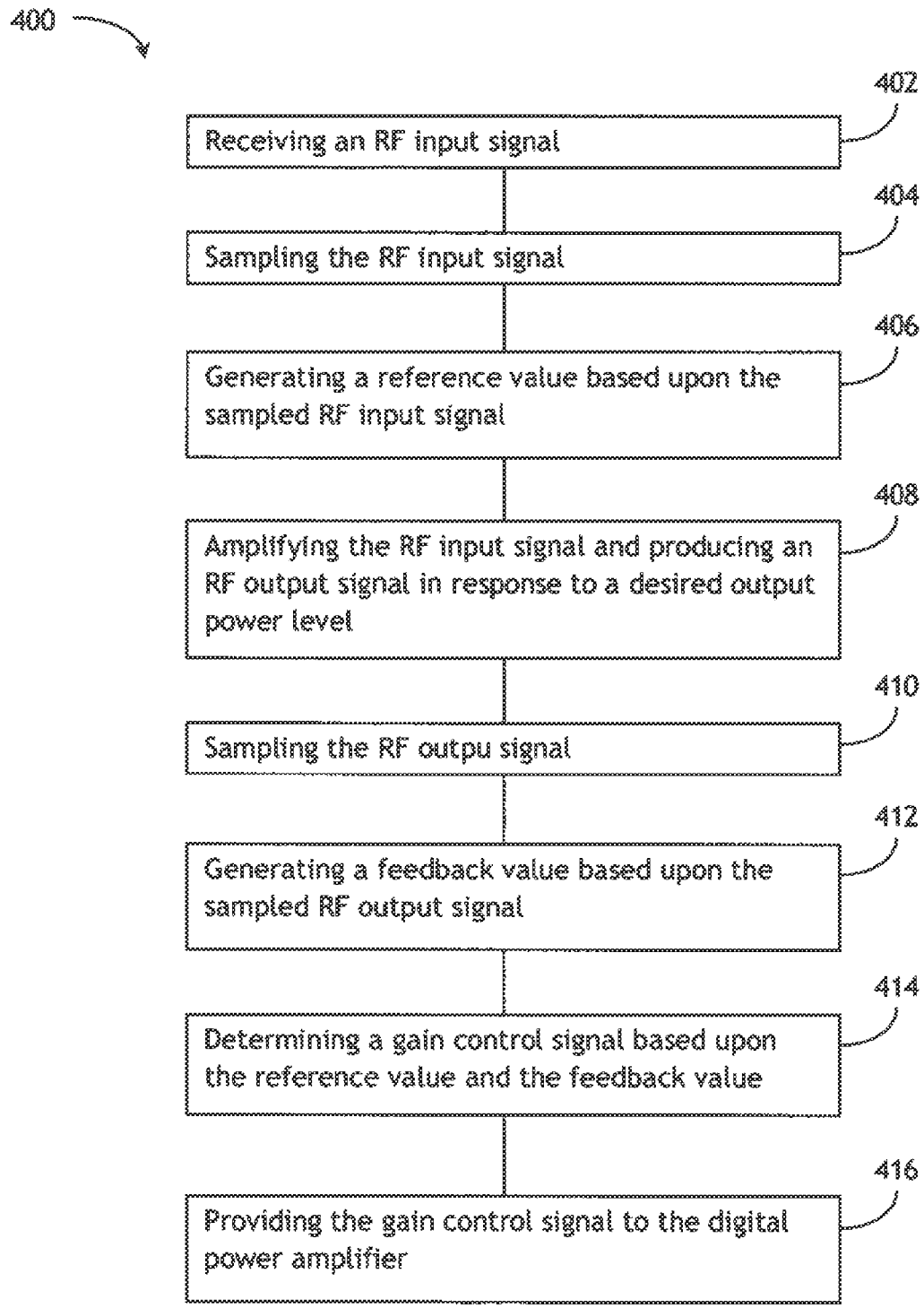
FIG. 4 is a flow chart illustrating a method for providing precise gain control in a digital power amplifier.

Referring now to FIG. 4, a method 400 for providing precise gain control in a digital power amplifier in accordance with the present disclosure is shown. The method 400 may generate a reference value based on the input signal and generate a feedback value based on the output signal. The precise gain control may be provided by providing gain control adjustments in order to minimize the differences between the reference value and the feedback value.

In one embodiment, after receiving an RF input signal in step 402, the RF input signal may be sampled at a predetermined rate (e.g., 1% of the actual signal level) in step 404. The sampled RF input signal may be utilized to generate a reference value in step 406. For example, the reference value may be generated by detecting the RF envelope of the sampled RF input signal, determining the average power of the sampled RF input signal based on the RF envelope, and generating the reference value at least partially based upon the average power of the sampled RF input signal.

Step 408 may amplify the RF input signal and produce an RF output signal in response to a desired output power level. The RF output signal may be sampled at a predetermined rate (e.g., 1% of the actual signal level) in step 410, and a feedback value may be generated based upon the sampled RF output signal in step 412. For example, the feedback value may be generated by detecting the RF envelope of the sampled RF output signal, and determining the average power of the sampled RF output signal based on the RF envelope. The average power of the sampled RF output signal may be utilized as the feedback value.

Step 414 may determine a gain control signal based upon the reference value and the feedback value, and the gain control signal is provided to the digital power amplifier in step 416 to adjust the output of the digital power amplifier. In one embodiment, the gain control signal is determined based upon the difference between the reference value and the feedback value, wherein such differences are minimized. That is, the precise gain control is provided by trying to match the reference value and the feedback value for a given power level.

As previously described, a first level of attenuation may be applied to the RF input signal in the amplifying stage. In such cases, a second level of attenuation, which is inversely proportional to the first level of attenuation, may be applied to the sampled RF output signal prior to generating the feedback value in step 412.

It is understood that the present disclosure is not limited to any underlying implementing technology. The present disclosure may be implemented utilizing any combination of software and hardware technology. The present disclosure may be implemented using a variety of technologies without departing from the scope and spirit of the invention or without sacrificing all of its material advantages.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present disclosure and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A digital power amplifier, comprising:
an amplifying stage, the amplifying stage configured for applying a first level of attenuation to an RF input signal in response to a desired output power level of the digital power amplifier;
a reference loop, the reference loop configured for determining an average power of a sample of the RF input signal, the reference loop further configured for providing a reference value at least partially based upon the average power of the sample of the RF input signal;
a feedback loop, the feedback loop configured for applying a second level of attenuation to a sample of an output of the amplifying stage, the second level of attenuation being inversely proportional to the first level of attenuation, the feedback loop further configured for providing a feedback value indicating an average power of the attenuated sample of the output; and
an error amplifier, the error amplifier configured for providing a gain control adjustment signal to the amplifying stage, the gain control adjustment signal being determined based upon the reference value and the feedback value;
wherein the reference loop further comprises:
an RF envelop detector configured for detecting an RF envelope of the sample of the RF input signal;
an RF envelope filter configured for reducing variations of the RF envelope and determining the average power of the sample of the RF input signal; and
a multiplying digital to analogue converter (MDAC) gain adjustment unit configured for calculating the reference value based upon the average power of the sample of the RF input signal and a gain control signal, the MDAC gain adjustment unit further configured for providing the reference value to the error amplifier.

2. The digital power amplifier of claim 1, wherein the gain control adjustment signal is determined based upon a difference between the reference value and the feedback value.

3. The digital power amplifier of claim 1, wherein the RF envelope filter of the reference loop is configurable for filtering a selected bandwidth.

4. The digital power amplifier of claim 1, wherein the feedback loop further comprises:

an RF envelop detector configured for detecting an RF envelope of the attenuated sample of the output; and an RF envelope filter configured for reducing variations of the RF envelope and determining the average power of the attenuated sample of the output, the average power of the attenuated sample of the output is provided to the error amplifier as the feedback value.

5. The digital power amplifier of claim 4, wherein the RF envelope filter of the feedback loop is configurable for filtering a selected bandwidth.

6. The digital power amplifier of claim 1, wherein the amplifying stage further comprises a gain control element, the gain control element configured for receiving the gain control adjustment signal from the error amplifier, and the gain control element further configured for providing a variable gain to the RF input signal based on the gain control adjustment signal.

7. A digital power amplifier, comprising:
an amplifying stage, the amplifying stage configured for applying a first level of attenuation to an RF input signal in response to a desired output power level of the digital power amplifier;
a feedback loop, the feedback loop configured for applying a second level of attenuation to a sample of an output of the amplifying stage, the second level of attenuation being inversely proportional to the first level of attenuation, the feedback loop further configured for providing a feedback value indicating an average power of the attenuated sample of the output;
a power measurement unit, the power measurement unit configured for measuring the average power of the attenuated sample of the output and converting the measurement to a digitized power level;
an automatic level control, the automatic level control configured for providing a gain control signal based upon the digitized power level and the desired output power level of the digital power amplifier;
a reference loop, the reference loop configured for determining an average power of a sample of the RF input signal, the reference loop further configured for providing a reference value based upon the average power of the sample of the RF input signal and the gain control signal provided by the automatic level control; and
an error amplifier, the error amplifier configured for providing a control adjustment signal to the amplifying stage, the control adjustment signal being determined based upon the reference value and the feedback value.

8. The digital power amplifier of claim 7, wherein the gain control adjustment signal is determined based upon a difference between the reference value and the feedback value.

9. The digital power amplifier of claim 7, wherein the reference loop further comprises:
an RF envelop detector configured for detecting an RF envelope of the sample of the RF input signal;
an RF envelope filter configured for reducing variations of the RF envelope and determining the average power of the sample of the RF input signal; and
a multiplying digital to analogue converter (MDAC) gain adjustment unit configured for calculating the reference value based upon the average power of the sample of the RF input signal and the gain control signal, the MDAC gain adjustment unit further configured for providing the reference value to the error amplifier.

10. The digital power amplifier of claim 9, wherein the RF envelope filter of the reference loop is configurable for filtering a selected bandwidth.

11. The digital power amplifier of claim 7, wherein the feedback loop further comprises:
an RF envelop detector configured for detecting an RF envelope of the attenuated sample of the output; and
an RF envelope filter configured for reducing variations of the RF envelope and determining the average power of the attenuated sample of the output, the average power of the attenuated sample of the output is provided to the error amplifier as the feedback value.

12. The digital power amplifier of claim 11, wherein the RF envelope filter of the feedback loop is configurable for filtering a selected bandwidth.

13. The digital power amplifier of claim 7, wherein the amplifying stage further comprises a gain control element, the gain control element configured for receiving the gain control adjustment signal from the error amplifier, and the gain control element further configured for providing a variable gain to the RF input signal based on the gain control adjustment signal.

14. A method for providing gain control in a digital power amplifier, the method comprising:
receiving an RF input signal;
sampling the RF input signal;
generating a reference value based upon the sampled RF input signal, further comprising:
detecting an RF envelope of the sampled RF input signal;
determining an average power of the sampled RF input signal based on the RF envelope; and
generating the reference value utilizing a multiplying digital to analogue converter (MDAC) gain adjustment unit at least partially based upon the average power of the sampled RF input signal;
amplifying the RF input signal and producing an RF output signal in response to a desired output power level;
sampling the RF output signal;
generating a feedback value based upon the sampled RF output signal;
determining a gain control signal based upon the reference value and the feedback value; and
providing the gain control signal to the digital power amplifier.

15. The method of claim 14, wherein generating a feedback value based upon the sampled RF output signal further comprises:
detecting an RF envelope of the sampled RF output signal;
determining an average power of the sampled RF output signal based on the RF envelope; and
providing the average power of the sampled RF output signal as the feedback value.

16. The method of claim 14, wherein the gain control signal is determined based upon a difference between the reference value and the feedback value.

17. The method of claim 14, further comprising:
while amplifying the RF input signal, applying a first level of attenuation to the RF input signal in response to the desired output power level; and
prior to generating the feedback value, applying a second level of attenuation to the sampled RF output signal, the second level of attenuation being inversely proportional to the first level of attenuation.

* * * * *